United States Patent
Cheah

(12) 
(10) Patent No.: US 7,199,477 B1
(45) Date of Patent: Apr. 3, 2007

(54) MULTI-TIERED LEAD PACKAGE FOR AN INTEGRATED CIRCUIT

(75) Inventor: Eng-Chew Cheah, San Jose, CA (US)

(73) Assignee: Altera Corporation, San Jose, CA (US)

( * ) Notice: Subject to any disclaimer, the term of this patent is extended or adjusted under 35 U.S.C. 154(b) by 605 days.

(21) Appl. No.: 09/863,652

(22) Filed: May 22, 2001

Related U.S. Application Data

(60) Provisional application No. 60/236,495, filed on Sep. 29, 2000.

(51) Int. Cl.
*H01L 23/48* (2006.01)
*H01L 23/52* (2006.01)
*H01L 29/40* (2006.01)

(52) U.S. Cl. .............................. 257/784; 257/E23.024; 257/E23.07

(58) Field of Classification Search ................ 257/784, 257/690, 773, 676, 666
See application file for complete search history.

(56) References Cited

U.S. PATENT DOCUMENTS

| | | | | |
|---|---|---|---|---|
| 4,771,330 A | * | 9/1988 | Long ............................ | 357/68 |
| 4,903,114 A | * | 2/1990 | Aoki et al. ................... | 257/666 |
| 5,168,368 A | * | 12/1992 | Gow, 3rd et al. ............ | 257/666 |
| 5,889,308 A | * | 3/1999 | Hong et al. .................. | 257/355 |
| 5,905,299 A | * | 5/1999 | Lacap .......................... | 257/666 |
| 6,040,621 A | * | 3/2000 | Nose ............................ | 257/666 |
| 6,265,762 B1 | * | 7/2001 | Tanaka et al. ............... | 257/676 |
| 6,297,545 B1 | * | 10/2001 | Sugiyama et al. ........... | 257/666 |
| 6,313,519 B1 | * | 11/2001 | Gainey et al. ............... | 257/676 |
| 2002/0024122 A1 | * | 2/2002 | Jung et al. | |

FOREIGN PATENT DOCUMENTS

| | | | |
|---|---|---|---|
| JP | 5-198728 | * | 8/1993 |
| JP | 5-206363 | * | 8/1993 |
| JP | 5-335366 | * | 12/1993 |
| JP | 6-177312 | * | 6/1994 |

OTHER PUBLICATIONS

The American Heritage® Dictionary of the English Language, 4th edition (AHD), published by Houghton-Mifflin Company, 2000.*

* cited by examiner

*Primary Examiner*—David A. Zarneke
(74) *Attorney, Agent, or Firm*—Morgan, Lewis & Bockius LLP

(57) ABSTRACT

A package for a semiconductor die comprises a semiconductor die with a bond pad. The package further includes a package lead and a bond wire with a first end portion coupled to the package lead, a second end portion coupled to the bond pad, and an intermediate portion. A non-conductive intermediate lead finger mounting substrate with an intermediate lead finger is positioned within the package. The intermediate lead finger is positioned between the lead finger and the bond pad and is attached to the intermediate portion of the bond wire.

5 Claims, 3 Drawing Sheets

MULTI-TIERED LEAD PACKAGE FOR AN INTEGRATED CIRCUIT

This application claims priority to the provisional patent application entitled, "Multi-tiered Lead Package for an Integrated Circuit," Ser. No. 60/236,495, filed Sep. 29, 2000.

BRIEF DESCRIPTION OF THE INVENTION

The present invention relates generally to the field of semiconductor packaging. More specifically, the present invention relates to a multi-tiered lead package for an integrated circuit.

BACKGROUND OF THE INVENTION

Most integrated circuit packages share a substantially standard construction. Specifically, the actual circuitry is on a semiconductor die, which is mounted, usually by adhesive, to a relatively large (as compared to the die) mass or "slug" which acts as a heat sink.

The die has a plurality of bond pads through which power, ground, and signals are communicated outside the die. Bond wires are bonded, typically by a process known as "wirebonding," to the bond pads. The other ends of the bond wires are wirebonded to one of a plurality of metallic lead fingers, or package leads, that lay on the heat sinking mass but are separated from it by a non-conductive layer. The non-conductive layer is typically an insulating adhesive tape, although it may be other materials such as a ceramic layer bonded to the heat sinking mass.

The package leads are generally formed by stamping from a single sheet of suitable conductive metal. The portions which are to protrude from the package as pins are joined together by a rectangular band of metal at their outer extremities, forming a unit known as a leadframe. To assemble the integrated circuit package, the insulating layer is applied to the heat sinking mass, and the leadframe is attached in place. The die is subsequently affixed, and the wire leads are wirebonded to the appropriate bond pads and package leads.

The entire assembly is then encased in a plastic or epoxy "mold compound" with ends of the package leads protruding as pins for connection to external devices.

As integrated circuit devices become more complex, the die sizes are becoming smaller. Decreasing die sizes have resulted in finer bond pad pitches, longer bond wire lengths, and closer wire-to-wire separation. At the same time, bond wire diameters are becoming thinner.

With the increase of bond wire span, reduction of bond wire diameter, and reduction in wire-to-wire separation, various problems arise in the assembling of packages for these integrated circuits. One particularly glaring problem is that, during molding, liquefied molding materials flow over the top of the die, causing adjacent bond wires to come into contact with each other to form short-circuits.

Accordingly, it would be highly desirable to provide an improved integrated circuit package that overcomes the problems associated with increasing bond wire span, reduced bond wire diameter, and reduced wire-to-wire separation.

SUMMARY OF THE DISCLOSURE

The present invention provides a multi-tiered lead package for an integrated circuit. The package includes a semiconductor die, a bond pad, a package lead, and a bond wire having a first end portion coupled to the package lead, a second end portion coupled to the bond pad, and an intermediate portion. An intermediate lead finger mounting substrate with an intermediate lead finger is positioned within the package. The intermediate lead finger is positioned between the package lead and the bond pad and is attached to the intermediate portion of the bond wire.

The invention also provides a method of forming a semiconductor package. An intermediate lead finger mounting substrate with an intermediate lead finger is provided. A semiconductor die is positioned on the intermediate lead finger mounting substrate. A bond wire is attached to the semiconductor die, the intermediate lead finger, and a package lead positioned on the outside perimeter of the semiconductor die.

The intermediate lead finger mounting substrate provides for more secure bond wire connections. Thus, the package of the invention reduces short circuits between adjacent bond wires and otherwise provides bond wires that are less susceptible to physical damage.

BRIEF DESCRIPTION OF THE DRAWING

For a better understanding of the invention, reference should be made to the following detailed description taken in conjunction with the accompanying drawings, in which.

Like reference numerals refer to corresponding parts throughout the drawings.

DETAILED DESCRIPTION OF THE DRAWINGS

Figure 1A:
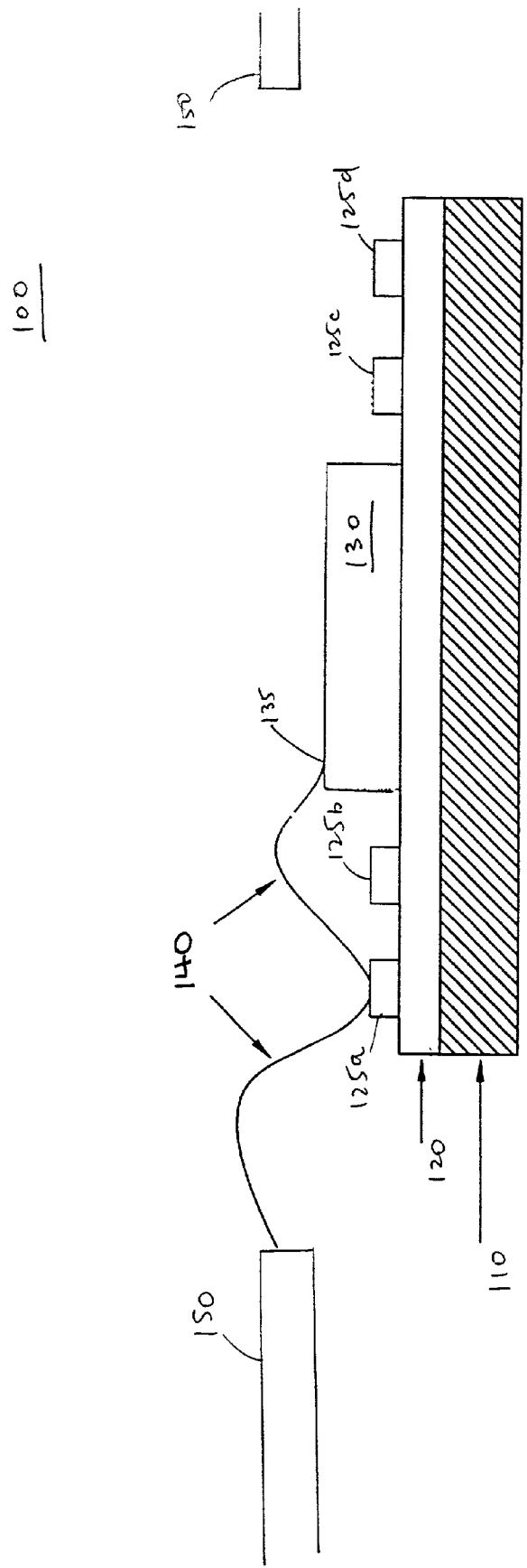
FIG. 1A illustrates a cross-sectional view of a multi-tiered lead package according to an embodiment of the present invention.

FIG. 1A illustrates a cross-sectional view of a multi-tiered lead package 100 according to an embodiment of the present invention. As shown, the multi-tiered lead package 100 includes a first Die Attachment Pad (DAP) 110 in the form of a heat sink. The first DAP may be made of metal (e.g., copper) for rapid heat dissipation. Positioned on the heat sink 110 is a second DAP 120, referred to as an intermediate lead finger mounting substrate. The intermediate lead finger mounting substrate 120 is made of a non-conductive material and operates as an intermediate attachment point for bond wires. Intermediate attachment points for the bond wires need to be non-conductive; thus, only portions of the intermediate lead finger mounting substrate 120 need to be non-conductive.

A die 130 is positioned on the intermediate lead finger mounting substrate 120. In particular, the die 130 is positioned within a set of intermediate lead fingers 125a–125d formed on the intermediate lead finger mounting substrate 120. The intermediate lead fingers 125a–125d are positioned approximately halfway between bond pads of the die 130 and package leads 150 of the package.

Figure 1B:
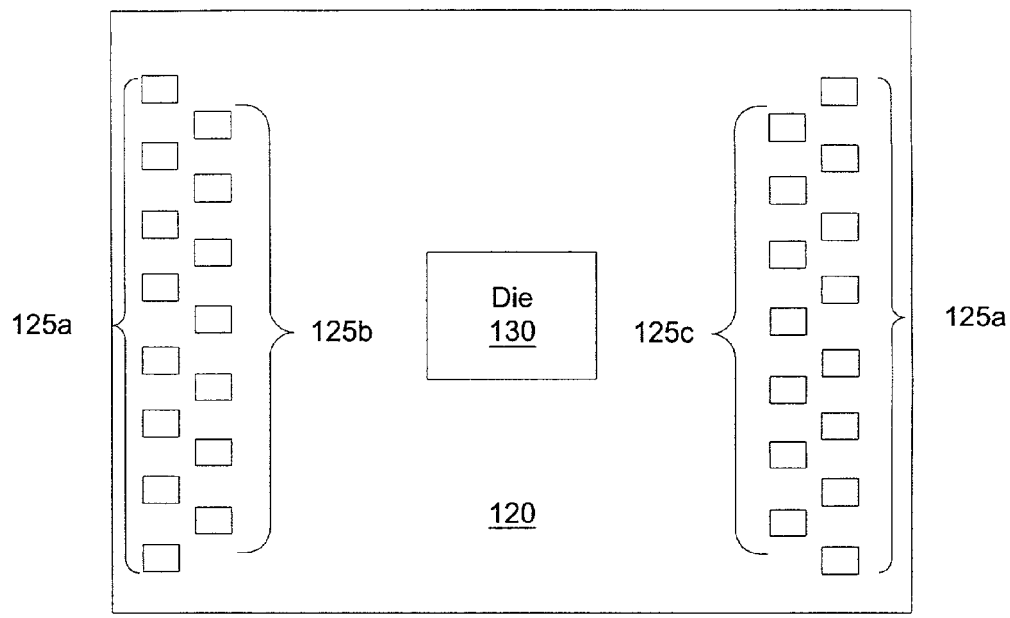
FIG. 1B illustrates a top plan view of the multi-tiered lead package of FIG. 1A.

A top plan view of the multi-tiered package 100 illustrating the arrangement of the intermediate lead fingers 125a–125d is shown in FIG. 1B. For clarity, the bond pads of the die 130, the lead fingers 150 and the bond wires 140 are not illustrated in FIG. 1B.

A bond wire 140 is also shown in FIG. 1A. One end of the bond wire 140 is connected to the package lead 150, and another end is connected to the bond pad 135. Significantly, a portion of the bond wire 140 is attached to the intermediate lead finger 125a. One effect of attaching the bond wire 140 to the intermediate lead finger 125a is that the movement of bond wire 140 is now more limited because the bond wire 140 is effectively divided into two shorter portions. Because of their shorter length, these portions are less likely to encroach upon other bond wires when molding material is poured over the package 100. As a result, the chance of causing short-circuits among adjacent bond wires during molding is reduced. The relatively short bond wire segments associated with the invention have greater structural integrity, thereby reducing the chance of creating a short with an adjacent bond wire and otherwise operating to withstand mechanical stress.

Figure 1C:
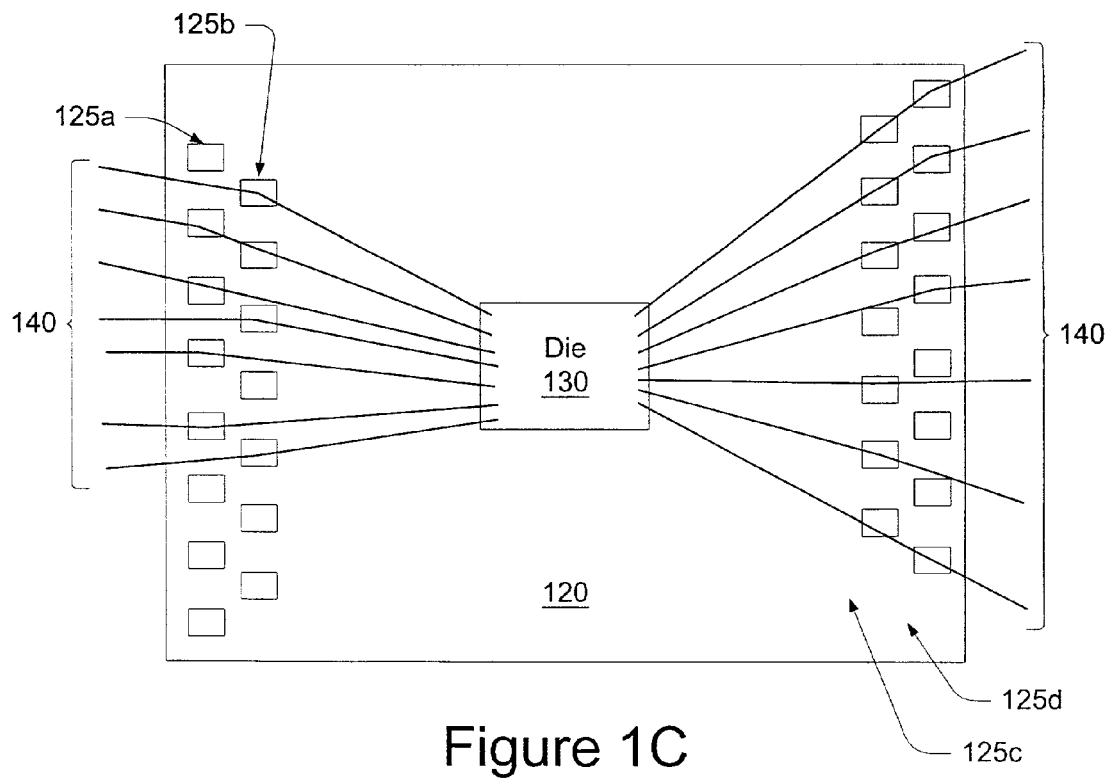
FIG. 1C illustrates a top plan view of the multi-tiered lead package of FIG. 1A showing multiple bond wires that are attached to the intermediate lead fingers.

A top plan view of the multi-tiered package 100 with several bond wires 140 attached to the bond pads of the die 130 and the intermediate bond fingers 125a–125d is illustrated in FIG. 1C.

Figure 2:
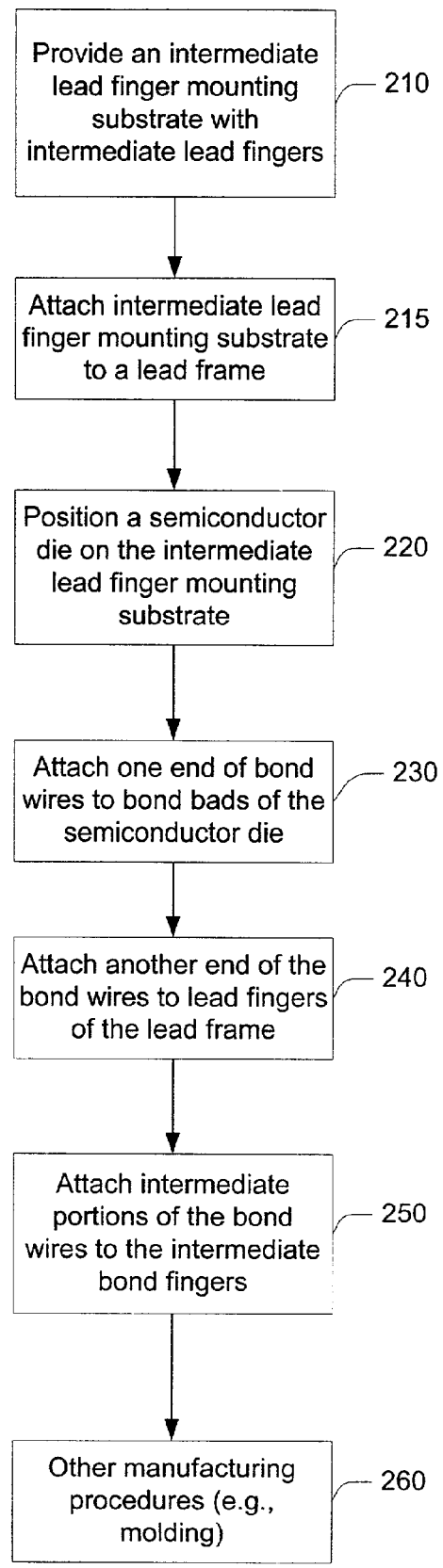
FIG. 2 is a flow diagram illustrating a method of forming a semiconductor package according to an embodiment of the present invention.

FIG. 2 is a flow diagram illustrating a process 200 for manufacturing a multi-tiered lead package in accordance with one embodiment of the present invention. At step 210, an intermediate lead finger mounting substrate with intermediate lead fingers is provided.

At step 215, the intermediate lead finger mounting substrate is attached to a lead frame, which includes a plurality of lead fingers and a DAP. In one embodiment, the DAP may be made of copper for high heat dissipation.

At step 220, a semiconductor die is positioned on the intermediate lead finger mounting substrate.

At step 230, bond wires are attached to the bond pads of the semiconductor die.

At step 240, the bond wires are attached to package leads of the lead frame.

At step 250, intermediate portions of the bond wires are attached to the intermediate bond fingers, rendering the bond wires less susceptible to swaying during subsequent manufacturing procedures.

At step 260, other manufacturing procedures, such as molding, are carried out. During these manufacturing procedures, such as molding, fewer short circuits may be formed because the intermediate portions of the bond wires are immobilized by the intermediate bond fingers.

The present invention, a multi-tiered lead package for an integrated circuit, has thus been disclosed. The foregoing descriptions of specific embodiments of the present invention are presented for purposes of illustration and description. They are not intended to be exhaustive or to limit the invention to the precise forms disclosed, obviously many modifications and variations are possible in view of the above teachings. For example, the non-conductive intermediate lead finger mounting substrate may be integrated into a heat sink 110, as long as the bond pads 125 are non-conductive.

The embodiments were chosen and described in order to best explain the principles of the invention and its practical applications, to thereby enable others skilled in the art to best utilize the invention and various embodiments with various modifications as are suited to the particular use contemplated.

What is claimed is:

1. A semiconductor package, comprising:
  an intermediate lead finger mounting substrate having a first surface and a second surface;
  a semiconductor die with a bond pad, the semiconductor die being attached on the first surface of the intermediate lead finger mounting substrate;
  a package lead;
  a bond wire comprising a first end portion coupled to the package lead, a second end portion coupled to the bond pad, and an intermediate portion;
  an intermediate lead finger mounted on the first surface of the intermediate lead finger mounting substrate, wherein the intermediate lead finger is positioned between the package lead and the bond pad, and wherein the intermediate lead finger is attached to the intermediate portion of the bond wire, and remains so attached through a subsequent molding process;
  a heat sink coupled to the second surface of the intermediate lead finger mounting substrate; and
  a mold compound that encloses the semiconductor die, a portion of the package lead, the bond wire, the intermediate lead finger, and the heat sink.

2. The package of claim 1, wherein the intermediate lead finger and the intermediate lead finger mounting substrate are formed of a non-conducting material.

3. The package of claim 1, wherein the intermediate lead finger comprises a non-conducting portion for attaching to the intermediate portion of the bond wire.

4. The package of claim 1, wherein the semiconductor die comprises a programmable logic device.

5. The package of claim 1, wherein the semiconductor die is mounted on a center portion of the first surface of the intermediate lead finger mounting substrate, and wherein the intermediate lead finger is mounted on a peripheral portion of the first surface of the intermediate lead finger mounting substrate.

* * * * *